US 9,350,353 B2

(12) United States Patent
Lin

(10) Patent No.: US 9,350,353 B2
(45) Date of Patent: May 24, 2016

(54) METHOD AND APPARATUS FOR EQUALIZING A LEVEL SHIFTED SIGNAL

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 28 days.

(21) Appl. No.: 14/191,531

(22) Filed: Feb. 27, 2014

(65) Prior Publication Data
US 2015/0244367 A1 Aug. 27, 2015

(51) Int. Cl.
H03K 19/0175 (2006.01)
H03K 19/0185 (2006.01)
H03K 19/018 (2006.01)

(52) U.S. Cl.
CPC .... H03K 19/01855 (2013.01); H03K 19/01806 (2013.01); H03K 19/017509 (2013.01); H03K 19/018507 (2013.01); H03K 19/018521 (2013.01)

(58) Field of Classification Search
CPC .......... H03K 19/18521; H03K 3/356113; H03K 19/018528; H03K 19/017581; H03K 19/00315; H03K 19/0013; H03K 19/00384; H03K 19/018585; H03K 19/1737; H03K 17/693; H03K 19/0948; H03K 19/215; H03K 19/017509; H03K 19/01806; H03K 19/018507; H03K 19/018521; H03K 19/018571; H03K 19/0843; G09G 2310/0289; G06F 17/505; H01L 21/8238; H01L 27/0922; H01L 27/11807
See application file for complete search history.

(56) References Cited

U.S. PATENT DOCUMENTS

| 5,682,110 A * | 10/1997 | Rountree ....................... 327/108 |
| 6,181,165 B1 * | 1/2001 | Hanson et al. .................. 326/81 |
| 6,191,630 B1 * | 2/2001 | Ozawa et al. .................. 327/278 |
| 6,236,237 B1 * | 5/2001 | Wong ................. H03K 19/0013 326/17 |
| 6,417,711 B2 | 7/2002 | Fulkerson |
| 6,563,356 B2 * | 5/2003 | Fulkerson .............. H03K 3/012 327/203 |
| 6,982,581 B2 * | 1/2006 | Dosho .................. H03K 5/1565 326/29 |
| 7,411,432 B1 * | 8/2008 | Zhu ............................... 327/117 |
| 7,764,085 B2 * | 7/2010 | Takahashi .............. H03K 5/086 326/82 |

(Continued)

OTHER PUBLICATIONS

Kim, et al.: "A 5.2-Gb/s Low-Swing Voltage-Mode Transmitter With an AC-/DC-Coupled Equalizer and a Voltage Offset Generator"; IEEE Transactions on Circuits and Systems—I: Regular Papers, vol. 61, No. I, Jan. 2014; pp. 213-225.

(Continued)

Primary Examiner — Vibol Tan
(74) Attorney, Agent, or Firm — McClure, Qualey & Rodack, LLP

(57) ABSTRACT

A method and apparatus are provided for equalizing an output of a level shifter so as to obtain a symmetrical transition. In one implementation, a transition equalizing inverter includes: an NMOS for establishing a high-to-low transition for an equalized signal in response to a low-to-high transition of an asymmetrical signal; a delay circuit for outputting a delayed signal in response to the asymmetrical signal; and a PMOS for establishing a low-to-high transition for the equalized signal in response to a high-to-low transition of the delayed signal, wherein a delay introduced by the delay circuit offsets a timing mismatch between a low-to-high transition and a high-to-low transition of the asymmetrical signal. In an embodiment, the delay circuit comprises a transmission gate. A corresponding method is also provided.

7 Claims, 6 Drawing Sheets

(56) References Cited

U.S. PATENT DOCUMENTS

| | | |
|---|---|---|
| 8,410,816 B1 | 4/2013 | Liu et al. |
| 2004/0108878 A1 | 6/2004 | Dosho et al. |

OTHER PUBLICATIONS

TW Office Action dated Jan. 20, 2016 in corresponding Taiwan application (No. 103128203).

\* cited by examiner

METHOD AND APPARATUS FOR EQUALIZING A LEVEL SHIFTED SIGNAL

BACKGROUND OF THE INVENTION

1. Field of the Invention

The present invention generally relates to level shifters.

2. Description of Related Art

A logic signal is a signal of either a high level or a low level, representing logic 1 or logic 0, respectively. Usually, the low level that represents the logic 0 is taken from a ground node and thus is said to be 0V; the high level that represents the logic 1 is taken from a power supply node. A level shifter receives an input logic signal having a first high level and outputs an output logic signal having a second high level, while both the input logic signal and the output logic signal have the same low level of 0V. If the second high level is higher than the first high level (e.g., the input logic signal is of either 1V or 0V, representing logic 1 and 0, respectively, while the output logic signal is of either 3.3V or 0V, representing logic 1 and 0, respectively), it is referred to as a low-to-high level shifter (L2H); if the second high level is lower than the first high level (e.g., the input logic signal is of either 3.3V or 0V, representing logic 1 and 0, respectively, while the output logic signal is of either 1V or 0V, representing logic 1 and 0, respectively), it is referred to as a high-to-low level shifter (H2L).

As depicted in FIG. 1A, a prior art L2H 100 receives an input logic signal $V_{I+}$ and its logic complement $V_{I-}$ and outputting an output logic signal $V_{O+}$ and its logic complement $V_{O-}$; L2H 100 comprises: a pair of thin-oxide NMOS (short for n-channel metal oxide semiconductor) transistor 101 and 102 for inversion purposes; a pair of thick-oxide NMOS transistors 103 and 104 for cascode purposes; and a pair of thick-oxide PMOS (short for p-channel metal oxide semiconductor) transistor 105 and 106 for latching purposes. Throughout this disclosure, $V_{DDH}$ denotes a supply voltage for a logic signal of a higher high level; while $V_{DDL}$ denotes a supply voltage for a logic signal of a lower high level.

In addition, VB denotes a bias voltage for a cascode device. As known to those of ordinary skill in the art, a thin-oxide device is suitable for handling a logic signal of a low level, while a thick-oxide device is suitable for handling a logic signal of a high level. The structure and operation of L2H 100 is well understood to those of ordinary skill in the art and thus is not described in detail here. An exemplary timing waveform 150 for L2H 100 is depicted in FIG. 1B. As shown in FIG. 1B, VI+ and VI− are complementary and are either VDDL or 0V; to be specific, a rising edge of VI− always accompanies a falling edge of VI+ (e.g., 152 accompanies 151), and a falling edge of VI− always accompanies a rising edge of VI+ (e.g., 156 accompanies 155). On the other hand, VO+ and VO− are either VDDH or 0V, but are not symmetrical, due to the fact that a low-to-high transition takes longer than a high-to-low transition. To be specific, a rising edge of VO•always trails a falling edge of VI+ (e.g., 154 trails 153), and a rising edge of VO+ always trails a falling edge of VI− (e.g., 157 trails 158). This is because a high-to-low transition of VO+ (VO−) is carried out through the inverting NMOS transistor 102 (101) and the cascode NMOS 104 (103), while a low-to-high transition of VO− (VO+) is executed through the inverting NMOS transistor 102 (101), the cascode NMOS transistor 104 (103), and the latching PMOS transistor 105 (106) and thus takes a longer time.

As depicted in FIG. 2A, a prior art H2L 200 receives an input logic signal VI+ and its logic complement VI− and outputs an output logic signal VO+ and its logic complement VO−. The H2L 200 comprises: a pair of thick-oxide NMOS transistors 201 and 202 is provided for inversion purposes; and a pair of thin-oxide PMOS transistors 205 and 206 is provided for latching purposes. H2L 200 is well understood to those of ordinary skill in the art and thus not described in detail here.

An exemplary timing waveform 250 for H2L 200 is depicted in FIG. 2B. As shown in FIG. 2B, VI+ and VI are complementary and are either VDDH or 0V; to be specific, a rising edge of $V_{I-}$ always accompanies a falling edge of $V_{I+}$ (e.g., 254 accompanies 253), and a falling edge of $V_{I-}$ always accompanies a rising edge of $V_{I+}$ (e.g., 258 accompanies 257). On the other hand, $V_{O+}$ and $V_{O-}$ are either $V_{DDR}$ or 0V, but are not symmetrical, due to the fact that a low-to-high transition takes longer than a high-to-low transition. To be specific, a rising edge of $V_{O-}$ always trails a falling edge of $V_{O+}$ (e.g., 252 trails 251), and a rising edge of $V_{O+}$ always trails a falling edge of $V_{O-}$ (e.g., 255 trails 256). This is because, a high-to-low transition of $V_{O+}$ ($V_{O-}$) is carried through the inverting NMOS transistor 202 (201), while a low-to-high transition of $V_{O-}$ ($V_{O+}$) is executed through the inverting NMOS transistor 202 (201), and the latching PMOS transistor 205 (206).

In summary, for both L2H 100 of FIG. 1A and H2L 200 of FIG. 2A, the output logic signal is asymmetrical in nature due to the fact that a low-to-high transition takes a longer time than a high-to-low transition. The fundamental reason is that a high-to-low transition can only be fulfilled by NMOS transistor, while a low-to-high transition can only be fulfilled by PMOS transistor; in other words, NMOS transistor establishes the low level (which is 0V, the same for both the input and the output), and PMOS transistor establishes the high level (which is either $V_{DDH}$ or $V_{DDR}$). In a level shifter (such as L2H 100 of FIG. 1A and H2L 200 of FIG. 2A), NMOS transistor is used for inversion purposes, while PMOS transistor is used for latching purposes; it inherently favors a high-to-low transition. This distorts a duty ratio of the output logic signal.

It is highly desirable that an output of a level shifter is symmetrical between low-to-high and high-to-low transitions.

BRIEF SUMMARY OF THIS INVENTION

What is disclosed in this present invention is method and apparatus for equalizing an output of a level shifter so as to obtain a symmetrical transition.

An objective of this present invention is to equalize a signal that has a longer delay in low-to-high transition than in high-to-low transition, so as to obtain an equalized signal that is symmetrical between both low-to-high and high-to-low transitions.

In an embodiment, a transition equalizing inverter comprises: an NMOS transistor for establishing a high-to-low transition for an equalized signal in response to a low-to-high transition of an asymmetrical signal; a delay circuit for outputting a delayed signal in response to the asymmetrical signal; and a PMOS transistor for establishing a low-to-high transition for the equalized signal in response to a high-to-low transition of the delayed signal, wherein a delay introduced by the delay circuit offsets a timing mismatch between a low-to-high transition and a high-to-low transition of the asymmetrical signal. In an embodiment, the delay circuit comprises a transmission gate.

In an embodiment, a method comprises: receiving a logic signal with a longer delay in low-to-high transition than in high-to-low transition; delaying the logic signal to obtain a delayed signal; inverting a rising edge of the logic signal to establish a high-to-low transition for an equalized signal using an NMOS transistor; and inverting a falling edge of the delayed signal to establish a low-to-high transition for the equalized signal using a PMOS transistor, wherein delaying the logic signal offsets a timing mismatch between a low-to-high transition and a high-to-low transition of the logic signal. In an embodiment, delaying the logic signal comprises using a transmission gate.

In an embodiment, an apparatus comprises: a level shifter for receiving an input signal along with its logic complement and outputting an output signal along with its logic complement; and a first transition equalizing inverter for receiving the logic complement of the output signal and outputting an equalized signal, wherein the first transition equalizing inverter establishes a high-to-low transition for the equalized signal in response to a low-to-high transition of the logic complement of the output signal using an NMOS transistor, and establishes a low-to-high transition for the equalized signal in response to a high-to-low transition of the logic complement of the output signal using a delay circuit and a PMOS transistor. In a further embodiment, the apparatus further comprises a second transition equalizing inverter for receiving the output signal and outputting a logic complement of the equalized signal. In a yet further embodiment, the apparatus further comprises a pair of CMOS inverters for cross-coupling the equalized signal and the logic complement of the equalized signal.

In an embodiment, a method comprises: receiving an input signal and its logic complement; performing a level shifting on the input signal and its logic complement to obtain an output signal and its logic complement; delaying the output signal to obtain a first delayed signal; inverting a rising edge of the output signal to establish a high-to-low transition for an equalized signal using a first NMOS transistor; and inverting a falling edge of the first delayed signal to establish a low-to-high transition for the equalized signal using a first PMOS transistor. In a further embodiment, the method further comprises: delaying the logic complement of the output signal to obtain a second delayed signal; inverting a rising edge of the logic complement of the output signal to establish a high-to-low transition for a logic complement of the equalized signal using a second NMOS transistor; and inverting a falling edge of the second delayed signal to establish a low-to-high transition for the logic complement of the equalized signal using a second PMOS transistor. In a yet further embodiment, the method further comprises cross-coupling the equalized signal and the logic complement of the equalized signal using a pair of CMOS inverters.

DETAILED DESCRIPTION OF THIS INVENTION

The present invention relates to level shifters, in particular to methods and apparatus for equalizing an output of level shifter. While the specifications described several example embodiments of the invention, it should be understood that the invention can be implemented in many ways and is not limited to the particular examples described below or to the particular manner in which any features of such examples are implemented. In other instances, well-known details are not shown or described to avoid obscuring aspects of the invention.

Figure 1A:
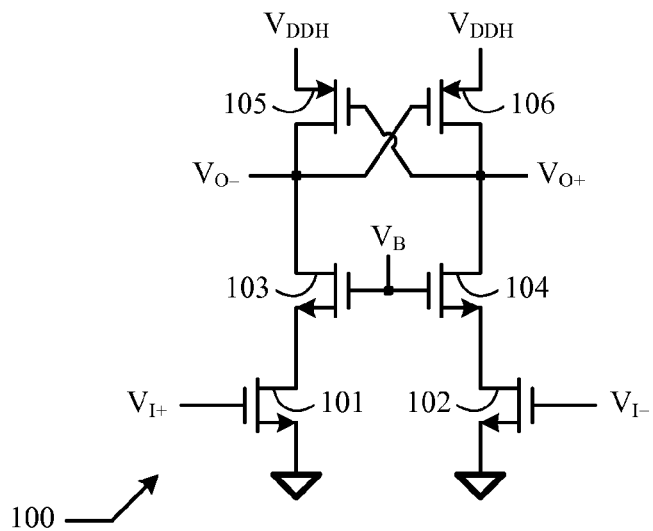
FIG. 1A shows a schematic diagram of a prior art low-to-high level shifter.
Figure 1B:
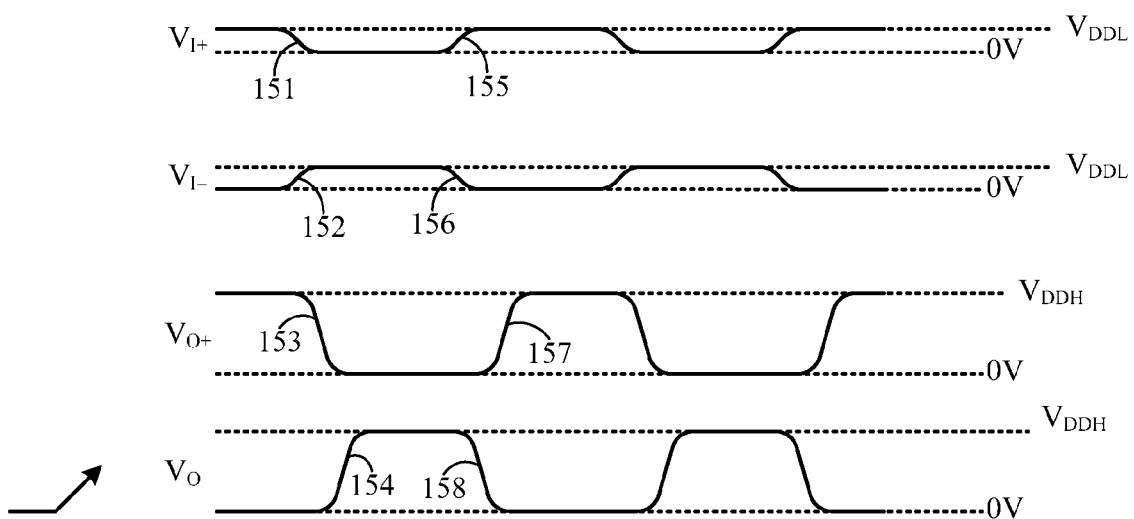
FIG. 1B shows an exemplary timing diagram for the low-to-high level shifter of FIG. 1A.
Figure 2A:
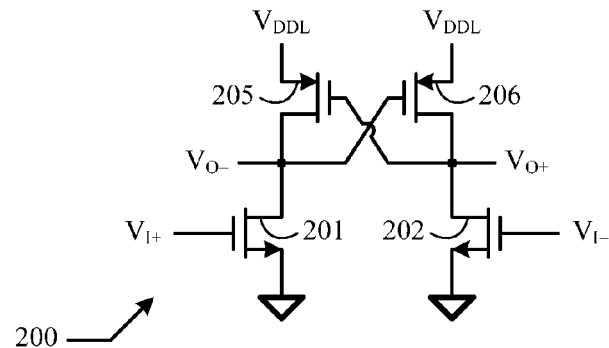
FIG. 2A shows a schematic diagram of a prior art high-to-low level shifter.
Figure 2B:
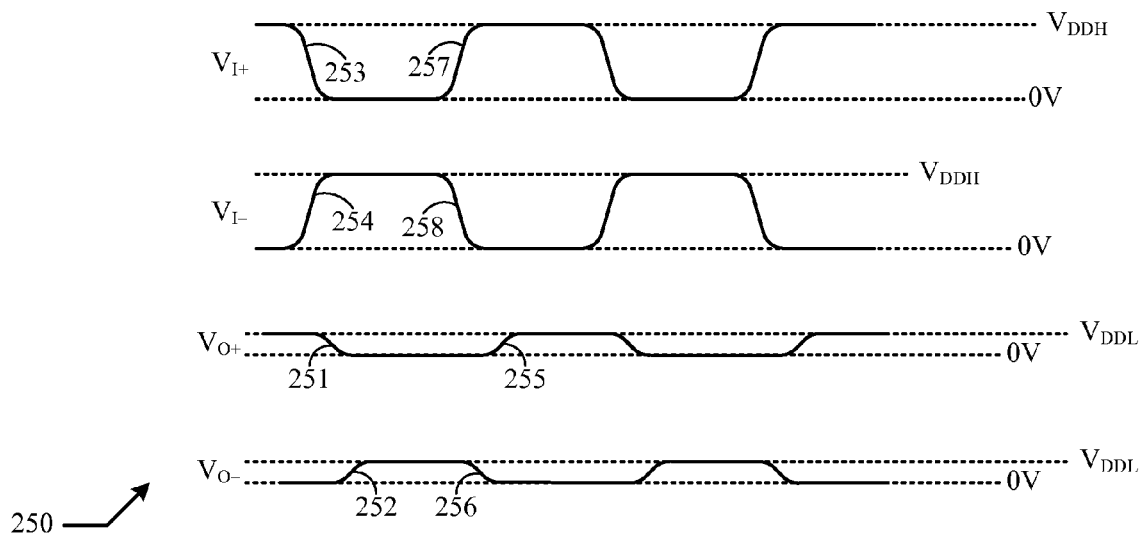
FIG. 2B shows an exemplary timing diagram for the high-to-low level shifter of FIG. 2A.
Figure 3A:
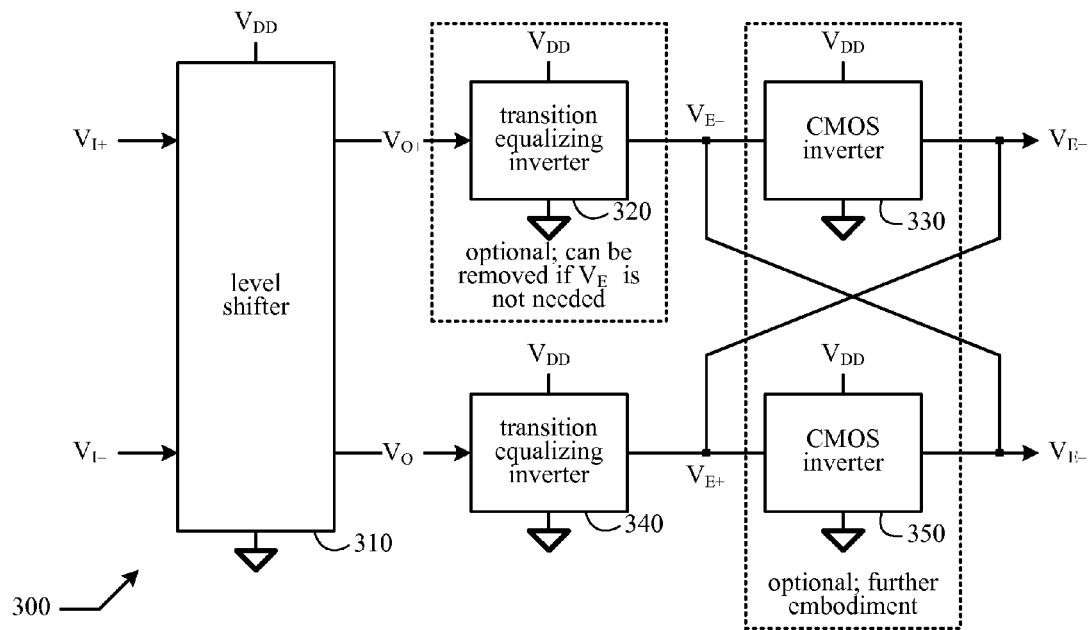
FIG. 3A shows a functional block diagram of an apparatus in accordance with an embodiment of the present invention.
Figure 3B:
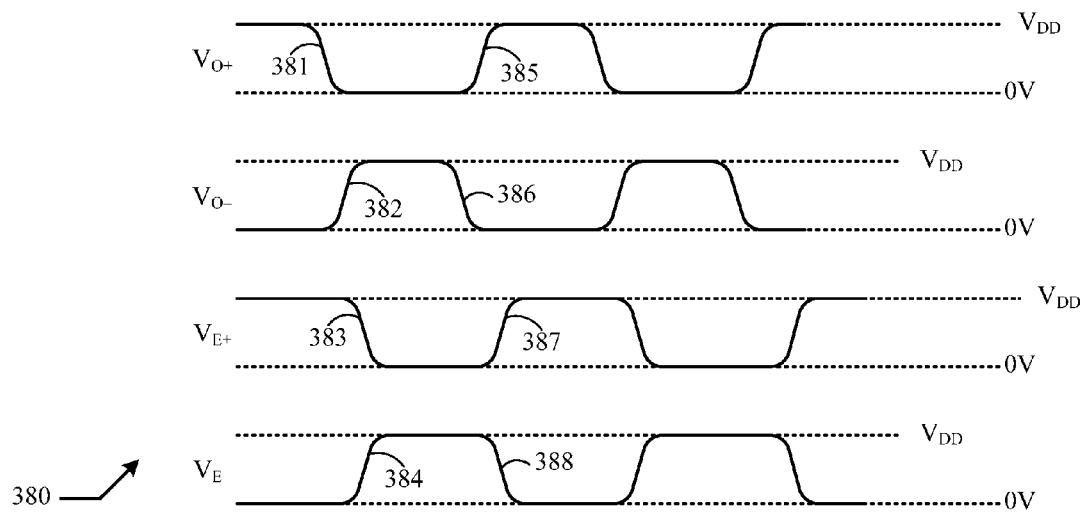
FIG. 3B shows an exemplary timing diagram for the apparatus of FIG. 3A.

As depicted in FIG. 3A, an apparatus 300 in accordance with an embodiment of the present invention comprises: a level shifter 310 for receiving an input logic signal VI+ along with its logic complement VI− and outputting an output logic signal VO+ along with its logic complement VO−; and a pair of transition equalizing inverters 340 and 320 for receiving VO− and VO+ and outputting an equalized logic signal VE+ and its logic complement VE−. In a further embodiment, a pair of cross-coupled CMOS (complementary metal oxide semiconductor) inverters 350 and 330 are incorporated for providing a cross-coupling between VE− and VE+. Here, the level shifter 310 is either L2H 100 of FIG. 1A or H2L 200 of FIG. 2A, and VDD denotes either VDDH or VDDL, which has been defined earlier. A transition equalizing inverter is an inverter that is asymmetrical in nature, as it takes a longer time to make a low-to-high transition than to make a high-to-low transition. As illustrated by an exemplary timing diagram 380 shown in FIG. 3B, a rising edge of VO− trails a corresponding falling edge of VO+ (e.g. 382 trails 352), and a rising edge of VO+ trails a corresponding falling edge of VO− (e.g. 385 trails 386), due to the asymmetrical nature of the level shifter 310 of FIG. 3A, as explained earlier. However, due to using transition equalizing inverters 320 and 340, which take a longer time to make a low-to-high transition than to make a high-to-low transition, the asymmetrical nature of the output logic signal and its logic complement (i.e., VO+ and VO−) is corrected; as a result, a rising edge of VE− aligns with a corresponding falling edge of VE+ (e.g. 384 aligns with 383), and a rising edge of VE+ align with a corresponding falling edge of VE− (e.g. 387 aligns with 388). In the further embodiment, the cross-coupled CMOS inverters 350 and 330 are incorporated for providing a further equalization for the equalized complementary logic signal to correct a residual timing mismatch between a rising edge and a falling edge, if applicable.

Figure 4:
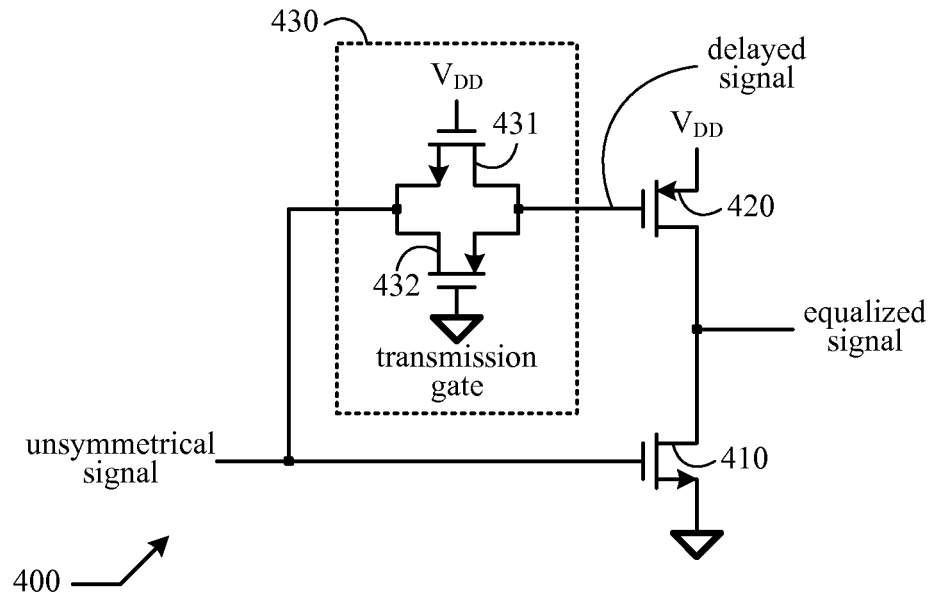
FIG. 4 shows a schematic diagram an embodiment of a transition equalizing inverter for the apparatus of FIG. 3A.

A schematic diagram of a transition equalizing inverter 400 suitable for embodying transition equalizing inverters 320 and 340 of FIG. 3A is depicted in FIG. 4. Transition equalizing inverter 400 receives an asymmetrical signal (which is VO+ for 320 and VO− for 340) and outputs an equalized signal (which is VE− for 320 and VE+ for 340). Transition equalizing inverter 400 comprises: an inverting NMOS transistor 410 for making a high-to-low transition for the equalized signal in response to a low-to-high transition of the asymmetrical signal; a delay circuit embodied by a transmission gate 430 comprising a transmitting NMOS transistor 431 and a transmitting PMOS 432 for receiving the asymmetrical signal and outputting a delayed signal; and an inverting PMOS transistor 420 for making a low-to-high transition for the equalized signal in response to a high-to-low transition of the delayed signal. Since the asymmetrical signal comes from a preceding level shifter, a high-to-low transition in the asymmetrical signal has an advanced timing, compared to a low-to-high transition, as described earlier. By using the delay circuit embodied by transmission gate 430 for delaying the asymmetrical signal into the delayed signal, the advanced timing is offset, provided the delay of the transmission gate 430 matches the timing mismatch between a rising edge and a falling edge of the asymmetrical signal (which is the output logic signal of the preceding level shifter). Note that using transmission gate 430 is a preferred embodiment but not a limitation, as other delay circuits can be used to replace the transmission gate 430, as long as a delay caused by the delay circuit offsets the aforementioned timing mismatch between a rising edge and a falling edge of the asymmetrical signal.

Figure 5:
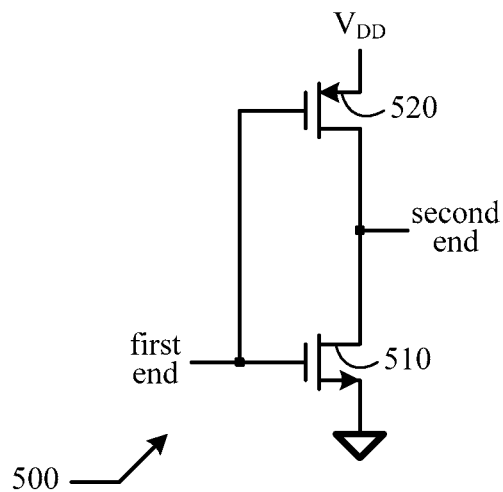
FIG. 5 shows a schematic diagram of an CMOS inverter for the apparatus of FIG. 3A

A schematic diagram of a CMOS inverter 500 suitable for embodying CMOS inverters 330 and 350 of FIG. 3A is depicted in FIG. 5. CMOS inverter 500 receives a first end of the equalized signal (which is VE+ and VE− for 330 and 350, respectively) and outputs a second end of the equalized signal (which is VE− and VE+ for 330 and 350, respectively). CMOS inverter 500 comprises an inverting NMOS transistor 510 and an inverting PMOS transistor 520.

In FIG. 3A, it is assumed that both VE+ and VE− are needed for subsequent circuits. If VE− is not needed, transition equalizing inverter 320, and CMOS inverters 330 and 350 can be removed; in this case, it is recommended that a load (e.g., a capacitor) that mimics an input impedance of the transition equalizing inverter 320 is incorporated to provide a termination for VO+. Those of ordinary skill in the art will appreciate how to apply the principle taught by the present invention to the case where VE+, instead of VE−, is not needed.

Note that throughout this disclosure, "+" and "−" are merely used to denote two signals that are complementary to each other; it doesn't matter which is denoted as "+" and which is denoted as "−", as either one can be said to be the signal of interest, while the other one then must be said to be the logic complement of the signal of interest. For instance, either VI+ or VI− can be said to be the input signal, while the other one then must be said to be the logic complement of the input signal; either VO+ or VO− can be said to be the output signal, while the other one then must be said to be the logic complement of the output signal; either VE+ or VE− can be said to be the equalized signal, while the other one then must be said to be the logic complement of the equalized signal.

Figure 6:
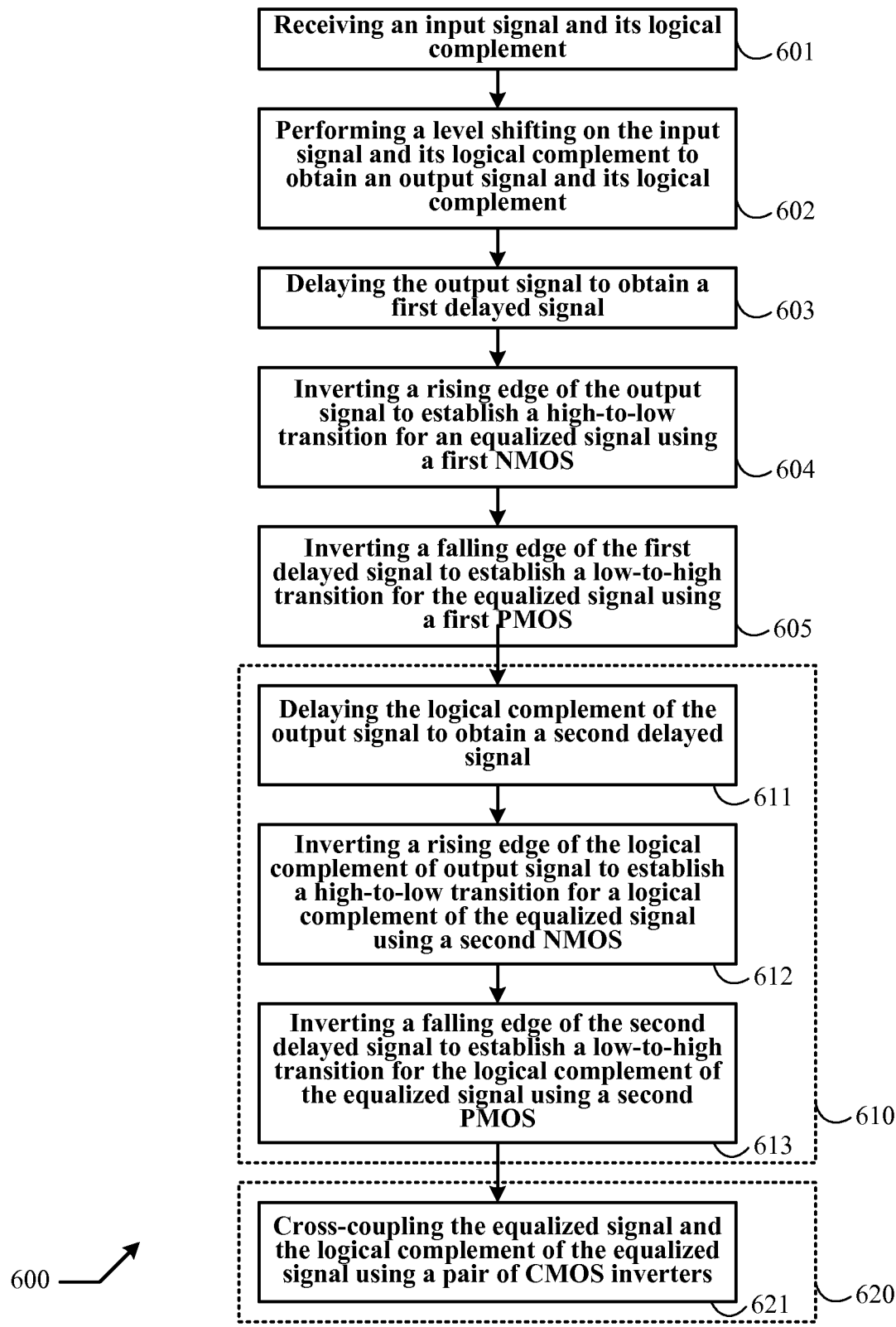
FIG. 6 shows a flow diagram for a method in accordance with an embodiment of the present invention.

In an embodiment in accordance with an embodiment of the present invention shown in flow diagram 600 in FIG. 6, a method comprises: step 601 for receiving an input signal and its logic complement; step 602 for performing a level shifting on the input signal and its logic complement to obtain an output signal and its logic complement; step 603 for delaying the output signal to obtain a first delayed signal; step 604 for inverting a rising edge of the output signal to establish a high-to-low transition for an equalized signal using a first NMOS transistor; and step 605 for inverting a falling edge of the first delayed signal to establish a low-to-high transition for the equalized signal using a first PMOS transistor. In a further embodiment shown in box 610, the method further comprises: step 611 for delaying the logic complement of the output signal to obtain a second delayed signal; step 612 for inverting a rising edge of the logic complement of the output signal to establish a high-to-low transition for a logic complement of the equalized signal using a second NMOS; and step 613 for inverting a falling edge of the second delayed signal to establish a low-to-high transition for the logic complement of the equalized signal using a second PMOS. In a yet further embodiment shown in box 620, the method further comprises cross-coupling the equalized signal and the logic complement of the equalized signal using a pair of CMOS inverters.

Figure 7:
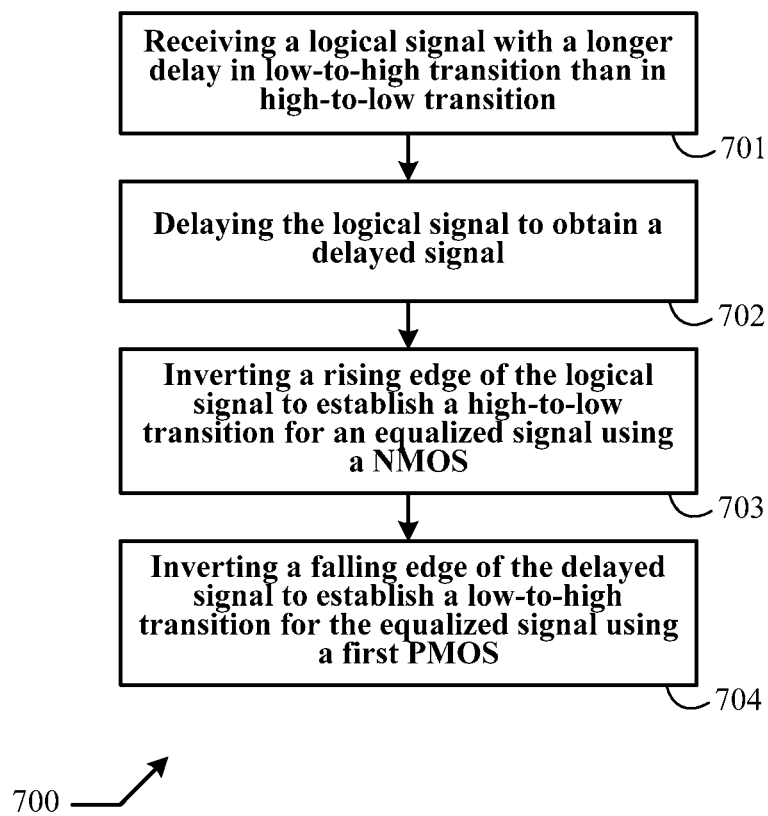
FIG. 7 shows another flow diagram for a method in accordance with an embodiment of the present invention.

In accordance with an embodiment of the present invention shown in flow diagram 700 in FIG. 7, a method comprises: step 701 for receiving a logic signal with a longer delay in low-to-high transition than in high-to-low transition; step 702 for delaying the logic signal to obtain a delayed signal; step 703 for inverting a rising edge of the logic signal to establish a high-to-low transition for an equalized signal using an NMOS transistor; and step 704 for inverting a falling edge of the delayed signal to establish a low-to-high transition for the equalized signal using a PMOS transistor.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An apparatus comprising:
   a level shifter for receiving an input signal along with its logic complement and outputting an output signal along with its logic complement, wherein the output signal and its logic complement are asymmetrical;
   a first transition equalizing inverter for receiving the logic complement of the output signal and outputting a first equalized signal, wherein the first transition equalizing inverter establishes a high-to-low transition for the first equalized signal in response to a low-to-high transition of the logic complement of the output signal using a first NMOS (n-channel metal-oxide semiconductor) transistor, and establishes a low-to-high transition for the first equalized signal in response to a high-to-low transition of the logic complement of the output signal using a first delay circuit and a first PMOS (p-channel metal-oxide semiconductor) transistor, the first NMOS transistor and the first delay circuit sharing a common input for receiving the logic complement of the output signal;
   a second transition equalizing inverter for receiving the output signal and outputting a second equalized signal, the first equalized signal a logic complement of the second equalized signal, wherein second transition equalizing inverter establishes a high-to-low transition for the second equalized signal in response to a low-to-high transition of the output signal using a second NMOS transistor, and establishes a low-to-high transition for the second equalized signal in response to a high-to-low transition of the output signal using a second delay circuit and a second PMOS transistor, the second NMOS transistor and the second delay circuit of the second transition equalizing inverter sharing a common input for receiving the output signal, wherein a rising edge of the second equalized signal aligns with a corresponding falling edge of the first equalized signal and a rising edge of the first equalized signal aligns with a corresponding falling edge of the second equalized signal; and
   plural cross-coupled CMOS inverters comprising first and second CMOS inverters, the plural cross-coupled CMOS inverters for cross-coupling the first equalized signal and the second equalized signal, wherein the first CMOS inverter receives the second equalized signal and outputs the first equalized signal, and the second CMOS inverter receives the first equalized signal and outputs the second equalized signal.

2. The apparatus of claim 1, wherein the first and second delay circuits are transmission gates.

3. The apparatus of claim 1, wherein a delay introduced by the delay circuits offset a timing mismatch between a low-to-high transition and a high-to-low transition of the logic complement of the output signal and the output signal.

4. The apparatus of claim 1, wherein the level shifter comprises two NMOS transistors for inversion purposes and two PMOS transistors for latching purposes.

5. A method comprising:
   receiving an input signal and its logic complement;
   performing a level shifting on the input signal and its logic complement to obtain an output signal and its logic complement, wherein the output signal and its logic complement are asymmetrical;
   delaying, using a first delay circuit, the output signal to obtain a first delayed signal;
   inverting a rising edge of the output signal to establish a high-to-low transition for an equalized signal using a first NMOS (n-channel metal-oxide semiconductor) transistor, the NMOS transistor and the first delay circuit sharing a common input for receiving the output signal;
   inverting a falling edge of the first delayed signal to establish a low-to-high transition for the first equalized signal using a first PMOS (p-channel metal-oxide semiconductor) transistor;
   delaying, using a second delay circuit, the logic complement of the output signal to obtain a second signal;
   inverting a rising edge of the logic complement of the output signal to establish a high-to-low transition for a logic complement of the equalized signal using a second NMOS transistor, the second NMOS transistor and the second delay circuit sharing a common input for receiving the logic complement of the output signal;
   inverting a falling edge of the second delayed signal to establish a low-to-high transition for the second equalized signal using a second PMOS transistor, wherein the asymmetry of the output signal and logic complement of the output signal is corrected by the collective delaying and inverting; and
   cross-coupling the equalized signal and the logic complement of the equalized signal using a pair of CMOS (complementary metal oxide semiconductor) inverters.

6. The apparatus of claim 1, wherein the level shifter comprises two NMOS transistors for inversion, two PMOS transistors for latching, and two NMOS transistors coupled between the two NMOS transistors and the two PMOS transistors.

7. The apparatus of claim 1, wherein the plural CMOS inverters each comprises a PMOS transistor and an NMOS transistor.

* * * * *